(12) United States Patent
Nakashima (10) Patent No.: US 10,830,798 B2
(45) Date of Patent: Nov. 10, 2020

(54) VOLTAGE VARIATION DETECTION CIRCUIT, SEMICONDUCTOR INTEGRATED CIRCUIT, AND VEHICLE

(71) Applicant: Rohm Co., Ltd., Kyoto (JP)

(72) Inventor: Takayuki Nakashima, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 379 days.

(21) Appl. No.: 15/834,241

(22) Filed: Dec. 7, 2017

(65) Prior Publication Data

US 2018/0164352 A1 Jun. 14, 2018

(30) Foreign Application Priority Data

Dec. 9, 2016 (JP) .................................. 2016-239612

(51) Int. Cl.
*G01R 19/165* (2006.01)
*H03K 5/24* (2006.01)
(Continued)

(52) U.S. Cl.
CPC ..... *G01R 19/16595* (2013.01); *G01R 19/257* (2013.01); *H03K 5/02* (2013.01); *H03K 5/24* (2013.01); *H03M 1/48* (2013.01)

(58) Field of Classification Search
CPC .. G01R 19/16595; G01R 19/257; H03K 5/24; H03K 5/02; H03M 1/48
See application file for complete search history.

(56) References Cited

U.S. PATENT DOCUMENTS 5,512,837 A * 4/1996 Ohnishi ........... G01R 19/16538
324/704
8,330,635 B2 * 12/2012 Hisamatsu ............. H03K 23/62
341/118
(Continued)

FOREIGN PATENT DOCUMENTS

CN 103532552 B * 8/2016
CN 103532552 B 8/2016
(Continued)

OTHER PUBLICATIONS

English machine translation of Li et al. CN 103532552 (Year: 2016).*
(Continued)

*Primary Examiner* — Lee E Rodak
(74) *Attorney, Agent, or Firm* — Fish & Richardson P.C.

(57) ABSTRACT

The voltage variation detection circuit includes: a threshold voltage generation circuit arranged to generate a threshold voltage; a comparator arranged to compare a variation detection-target voltage and the threshold voltage to each other; and a controller arranged to control the threshold voltage generation circuit based on output of the comparator. Repeated are operations of: decreasing the threshold voltage stepwise; when the variation detection-target voltage has come to the threshold voltage or more, first increasing the threshold voltage by specified steps and then again decreasing the threshold voltage stepwise; and when the variation detection-target voltage has come to the threshold voltage or more, increasing the threshold voltage by specified steps. The controller detects a variation of the variation detection-target voltage based on control results at time points when the variation detection-target voltage comes to the threshold voltage or more.

19 Claims, 5 Drawing Sheets

(51) Int. Cl.
  *H03K 5/02* (2006.01)
  *G01R 19/257* (2006.01)
  *H03M 1/48* (2006.01)

(56) References Cited

U.S. PATENT DOCUMENTS

| | | | |
|---|---|---|---|
| 8,749,224 B2* | 6/2014 | Matsushita | G01R 19/16542 |
| | | | 324/76.11 |
| 8,773,544 B2* | 7/2014 | Koh | H04N 5/23245 |
| | | | 341/169 |
| 2009/0267821 A1 | 10/2009 | Chmelar et al. | |
| 2009/0303096 A1 | 12/2009 | Chmelar | |
| 2010/0207798 A1* | 8/2010 | Lim | H03K 21/023 |
| | | | 341/155 |
| 2011/0074994 A1* | 3/2011 | Wakabayashi | H03M 1/0658 |
| | | | 348/302 |
| 2012/0008028 A1 | 1/2012 | Egawa | |
| 2013/0032695 A1 | 2/2013 | Ishibashi | |
| 2013/0293754 A1 | 11/2013 | Wakabayashi et al. | |
| 2014/0119140 A1* | 5/2014 | Seol | H03K 5/1565 |
| | | | 365/191 |
| 2014/0160331 A1 | 6/2014 | Murakami et al. | |
| 2014/0211055 A1 | 7/2014 | Wakabayashi et al. | |
| 2014/0225760 A1 | 8/2014 | Yang | |
| 2014/0240568 A1 | 8/2014 | Yamagata et al. | |

FOREIGN PATENT DOCUMENTS

| | | |
|---|---|---|
| EP | 2290823 A1 | 3/2011 |
| EP | 2555509 A1 | 2/2013 |
| JP | 2005-326313 | 11/2005 |
| WO | 2013042918 A1 | 3/2013 |

OTHER PUBLICATIONS

Jim, "Converters," pp. 1-20, XP055468039, Retrieved from the internet: URL:www.site.uottawa.ca/~rhabash/ELG3336LN (Nov. 1, 2012).

Chen, M. "Analog to Digital Converters," pp. 1-17, XP055468049, Retrieved from the internet: URL:https://www.physics.queensu.ca/"phys352/lect08.pdf (Feb. 3, 2010).

European Patent Office, Extended EP search report, Office Action in European application No. 17205996.6 (dated May 14, 2018).

* cited by examiner

FIG. 10

VOLTAGE VARIATION DETECTION CIRCUIT, SEMICONDUCTOR INTEGRATED CIRCUIT, AND VEHICLE

This nonprovisional application claims priority under 35 U.S.C. § 119(a) on Patent Application No. 2016-239612 filed in Japan on Dec. 9, 2016, the entire contents of which are hereby incorporated by reference.

BACKGROUND OF THE INVENTION

Field of the Invention

The present invention relates to a voltage variation detection circuit arranged to detect voltage variations, as well as to a semiconductor integrated circuit and a vehicle each using the voltage variation detection circuit.

Description of the Related Art

In JP 2005-326313 A, there is proposed a voltage variation detection circuit arranged to convert a variation detection-target voltage into a digital value by an A/D converter, and to derive a variation width of the variation detection-target voltage from variation quantities of the digital value.

Unfortunately, the voltage variation detection circuit proposed in JP 2005-326313 A is provided in a structure involving the A/D converter. Thus, the result would be large-scale circuitry.

SUMMARY OF THE INVENTION

An object of the present invention is to provide a voltage variation detection circuit capable of detecting voltage variations with a structure involving no A/D converter, as well as to a semiconductor integrated circuit and a vehicle each using the voltage variation detection circuit.

A voltage variation detection circuit in one configuration disclosed herein includes: a threshold voltage generation circuit arranged to generate a threshold voltage; a comparator arranged to compare a variation detection-target voltage and the threshold voltage to each other; and a controller arranged to control the threshold voltage generation circuit based on output of the comparator, wherein the controller controls the threshold voltage generation circuit in such fashion that the threshold voltage generation circuit repeats operations of: decreasing the threshold voltage stepwise; when the variation detection-target voltage has come to the threshold voltage or more, first increasing the threshold voltage by specified steps and then again decreasing the threshold voltage stepwise; and when the variation detection-target voltage has come to the threshold voltage or more, increasing the threshold voltage by specified steps, and wherein the controller detects a variation of the variation detection-target voltage based on control results at time points when the variation detection-target voltage comes to the threshold voltage or more.

A voltage variation detection circuit in another configuration disclosed herein includes: a threshold voltage generation circuit arranged to generate a threshold voltage; a comparator arranged to compare a variation detection-target voltage and the threshold voltage to each other; and a controller arranged to control the threshold voltage generation circuit based on output of the comparator, wherein the controller controls the threshold voltage generation circuit in such fashion that the threshold voltage generation circuit repeats operations of: increasing the threshold voltage stepwise; when the variation detection-target voltage has come to the threshold voltage or less, first decreasing the threshold voltage by specified steps and then again increasing the threshold voltage stepwise; and when the variation detection-target voltage has come to the threshold voltage or less, decreasing the threshold voltage by specified steps, and wherein the controller detects a variation of the variation detection-target voltage based on control results at time points when the variation detection-target voltage comes to the threshold voltage or less.

A voltage variation detection circuit in still another configuration disclosed herein includes: a threshold voltage generation circuit arranged to generate a first threshold voltage and a second threshold voltage lower than the first threshold voltage; a first comparator arranged to compare a variation detection-target voltage and the first threshold voltage to each other; a second comparator arranged to compare the variation detection-target voltage and the second threshold voltage to each other; and a controller arranged to control the threshold voltage generation circuit based on output of the first comparator and output of the second comparator, wherein the controller controls the threshold voltage generation circuit in such fashion that the threshold voltage generation circuit repeats operations of: decreasing the first threshold voltage stepwise and increasing the second threshold voltage stepwise; when the variation detection-target voltage has come to the first threshold voltage or more or to the second threshold voltage or less, first increasing the first threshold voltage by specified steps and decreasing the second threshold voltage by specified steps and then again decreasing the first threshold voltage stepwise and increasing the second threshold voltage stepwise; and when the variation detection-target voltage has come to the threshold voltage or more or to the second threshold voltage or less, increasing the first threshold voltage by specified steps and decreasing the second threshold voltage by specified steps, and wherein the controller detects a variation of the variation detection-target voltage based on control results at time points when the variation detection-target voltage comes to the first threshold voltage or more or to the second threshold voltage or less.

A semiconductor integrated circuit disclosed herein includes: the voltage variation detection circuit in any one of the above-described configurations; and at least part of a voltage generation circuit arranged to generate the variation detection-target voltage.

A vehicle disclosed herein includes the semiconductor integrated circuit of the above-described configuration.

Meanings and effects of the present invention will become more apparent by the following description of embodiments. However, the following embodiments are no more than one embodiment of the invention, and therefore meanings of the terms of the present invention or its component elements are in no sense limited to those described in the following embodiments.

DESCRIPTION OF THE PREFERRED EMBODIMENTS

First Configuration Example

Figure 1:
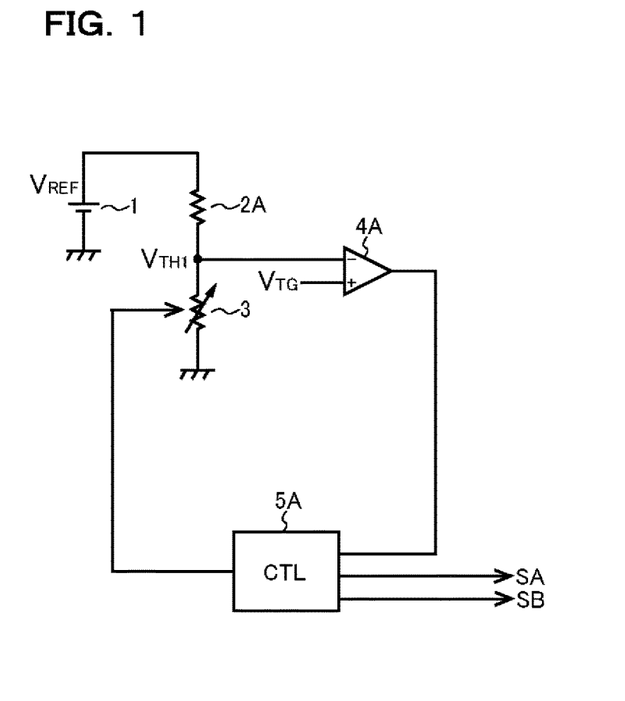
FIG. 1 is a diagram showing a first configuration example of a voltage variation detection circuit.

FIG. 1 is a diagram showing a first configuration example of the voltage variation detection circuit. The voltage variation detection circuit shown in FIG. 1 includes a constant voltage source 1, a fixed resistor 2A, a variable resistor 3, a comparator 4A, and a controller 5A.

Figure 2:
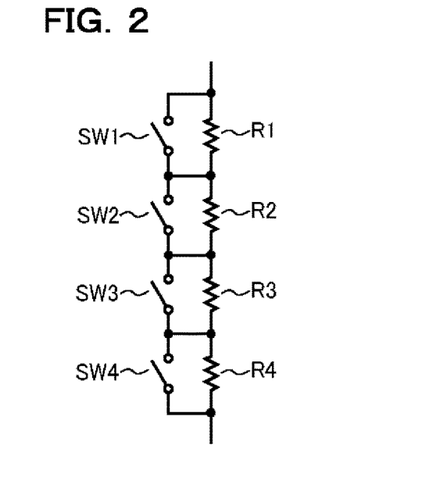
FIG. 2 is a diagram showing a configuration example of a variable resistor.

A threshold voltage generation circuit arranged to generate a first threshold voltage $V_{TH1}$ includes the constant voltage source 1, the fixed resistor 2A, and the variable resistor 3. The constant voltage source 1 generates a reference voltage $V_{REF}$. A voltage dividing circuit composed of the fixed resistor 2A and the variable resistor 3 generates the first threshold voltage $V_{TH1}$, which is a partial voltage of the reference voltage $V_{REF}$. The higher the resistance value of the variable resistor 3 becomes, the higher the first threshold voltage $V_{TH1}$ becomes. The variable resistor 3 may be so structured that, for example as shown in FIG. 2, resistors R1 to R4 are connected in series while switches SW1 to SW4 are connected in parallel to the resistors R1 to R4. With the structure shown in FIG. 2, assuming that a resistance-value ratio of the resistors R1 to R4 is $2^0:2^1:2^2:2^3$ as an example, the resistance value of the variable resistor 3 can be changed in $2^4$ steps at equal pitches.

The comparator 4A compares a variation detection-target voltage $V_{TG}$ and the first threshold voltage $V_{TH1}$ to each other. When the variation detection-target voltage $V_{TG}$ is equal to or more than the first threshold voltage $V_{TH1}$, the comparator 4A outputs a high-level signal. On the other hand, when the variation detection-target voltage $V_{TG}$ is less than the first threshold voltage $V_{TH1}$, the comparator 4A outputs a low-level signal.

The controller 5A controls the above-described threshold voltage generation circuit based on output of the comparator 4A. More specifically, the controller 5A controls resistance value of the variable resistor 3. In addition, it is also allowable that the constant voltage source 1 is changed to a variable voltage source, where the controller 5A controls output voltage of the variable voltage source.

Under the control by the controller 5A, the threshold voltage generation circuit repeats the following operations including:

(1) decreasing the first threshold voltage $V_{TH1}$ stepwise;

(2) when the variation detection-target voltage $V_{TG}$ has come to the first threshold voltage $V_{TH1}$ or more, increasing the first threshold voltage $V_{TH1}$ by specified steps;

(3) again decreasing the first threshold voltage $V_{TH1}$ stepwise; and (4) when the variation detection-target voltage $V_{TG}$ has come to the first threshold voltage $V_{TH1}$ or more, increasing the first threshold voltage $V_{TH1}$ by specified steps.

In addition, there are some cases where the first threshold voltage $V_{TH1}$ cannot be increased by specified steps because the first threshold voltage $V_{TH1}$ is excessively high at a time point when the variation detection-target voltage $V_{TG}$ comes to the first threshold voltage $V_{TH1}$ or more. In this case, the threshold voltage generation circuit sets the first threshold voltage $V_{TH1}$ to a maximum (see $V_{TH1\_MAX}$ in FIG. 3) instead of increasing the first threshold voltage $V_{TH1}$ by specified steps.

Figure 3:
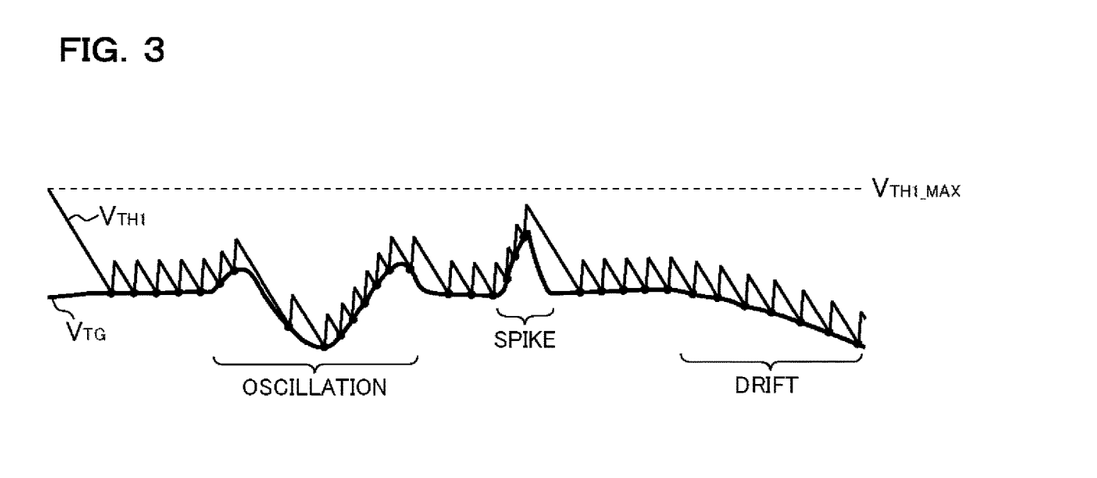
FIG. 3 is a time chart showing a detection-target voltage and a first threshold voltage.

With the above-described control by the controller 5A, the first threshold voltage $V_{TH1}$ varies as shown in FIG. 3. Although the first threshold voltage $V_{TH1}$ is charted seemingly in a continuously-varying way in FIG. 3 for convenience' sake, the first threshold voltage $V_{TH1}$ actually changes stepwise as apparent from the above description.

The controller 5A detects variations of the variation detection-target voltage $V_{TG}$ based on control results at time points of transition of the variation detection-target voltage $V_{TG}$ to the first threshold voltage $V_{TH1}$ or more (see black dots in FIG. 3). That is, from control results (resistance values of the variable resistor 3) at time points of transition of the variation detection-target voltage $V_{TG}$ to the first threshold voltage $V_{TH1}$ or more (see black dots in FIG. 3), the controller 5A detects values of the variation detection-target voltage $V_{TG}$ at the time points, respectively, of transition of the variation detection-target voltage $V_{TG}$ to the first threshold voltage $V_{TH1}$ or more (see black dots in FIG. 3), thereby detecting variations of the variation detection-target voltage $V_{TG}$. The controller 5A outputs a notification signal SA for notification of a detection result as to variations of the variation detection-target voltage $V_{TG}$. In addition, for cases in which a plurality of types of detection results as to variations of the variation detection-target voltage $V_{TG}$ are involved, the notification signal SA may be multi-valued or a plurality of types of notification signals SA may be provided.

The controller 5A may also be so arranged as to determine extremal values of the variation detection-target voltage $V_{TG}$, as an example, and detect an oscillation of the variation detection-target voltage $V_{TG}$ on condition that a group of determined extremal values has a specified periodicity.

The controller 5A may still also be so arranged as to determine a latest average value of the variation detection-target voltage $V_{TG}$ in a specified time period, as an example, and detect a spike of the variation detection-target voltage $V_{TG}$ on condition that a difference between the latest average value and a latest value of the variation detection-target voltage $V_{TG}$ is more than a specified extent.

The controller 5A may yet also be so arranged as to determine both a latest average value of the variation detection-target voltage $V_{TG}$ in a specified time period and a second latest average value of the variation detection-target voltage $V_{TG}$ in the specified time period, as an example, and detect a drift of the variation detection-target voltage $V_{TG}$ on condition that a difference between the latest average value and the second latest average value is more than a specified extent.

Further, on condition that the variation detection-target voltage $V_{TG}$ is equal to or more than the first threshold voltage $V_{TH1}$ at the time when the first threshold voltage $V_{TH1}$ is at a maximum, the controller 5A detects that the variation detection-target voltage $V_{TG}$ has become an overvoltage. Upon detection that the variation detection-target voltage $V_{TG}$ has become an overvoltage, the controller 5A outputs an overvoltage notification signal SB for notifying that the variation detection-target voltage $V_{TG}$ has become an overvoltage. Therefore, the voltage variation detection circuit shown in FIG. 1 serves also as an overvoltage detection circuit.

The above-described voltage variation detection circuit shown in FIG. 1 is enabled to detect variations in the variation detection-target voltage $V_{TG}$ with a structure involving no A/D converter.

In addition, only with the above-described operations, there would occur a glitch in the case where when the variation detection-target voltage $V_{TG}$ has come to the first threshold voltage $V_{TH1}$ or more and then the first threshold voltage $V_{TH1}$ is increased by specified steps, the variation detection-target voltage $V_{TG}$ becomes higher than the first threshold voltage $V_{TH1}$. More specifically, it is made impossible for the variation detection-target voltage $V_{TG}$ to come again to the first threshold voltage $V_{TH1}$ or more.

Accordingly, in the case where the variation detection-target voltage $V_{TG}$ does not come to the first threshold voltage $V_{TH1}$ or more even by decreasing the first threshold voltage $V_{TH1}$ stepwise until the first threshold voltage $V_{TH1}$ reaches a specified decrement or specified value, it is preferable that the threshold voltage generation circuit sets the first threshold voltage $V_{TH1}$ to a maximum before performing again the operation of decreasing the first threshold voltage $V_{TH1}$ stepwise.

Second Configuration Example

Figure 4:
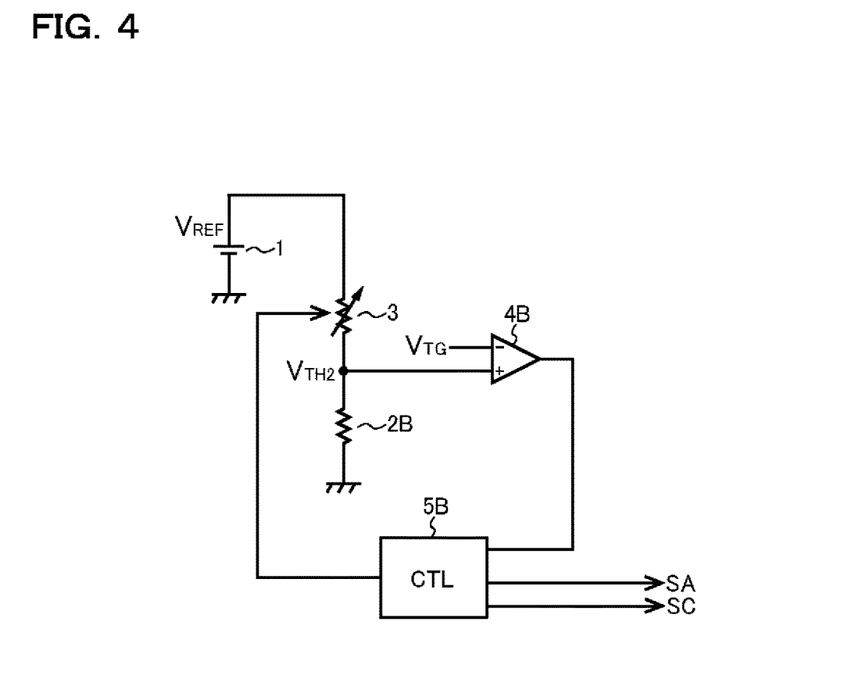
FIG. 4 is a diagram showing a second configuration example of the voltage variation detection circuit.

FIG. 4 is a diagram showing a second configuration example of the voltage variation detection circuit. The voltage variation detection circuit shown in FIG. 4 includes a constant voltage source 1, a variable resistor 3, a fixed resistor 2B, a comparator 4B, and a controller 5B. It is noted that the same component members in FIG. 4 as in FIG. 1 are designated by the same reference signs, and their detailed description is omitted.

A threshold voltage generation circuit arranged to generate a second threshold voltage $V_{TH2}$ includes the constant voltage source 1, the variable resistor 3, and the fixed resistor 2B. A voltage dividing circuit composed of the variable resistor 3 and the fixed resistor 2B generates a second threshold voltage $V_{TH2}$ which is a partial voltage of a reference voltage $V_{REF}$. The higher the resistance value of the variable resistor 3 becomes, the lower the second threshold voltage $V_{TH2}$ becomes.

The comparator 4B compares a variation detection-target voltage $V_{TG}$ and the second threshold voltage $V_{TH2}$ to each other. When the variation detection-target voltage $V_{TG}$ is equal to or less than the second threshold voltage $V_{TH2}$, the comparator 4B outputs a high-level signal. On the other hand, when the variation detection-target voltage $V_{TG}$ is higher than the second threshold voltage $V_{TH2}$, the comparator 4B outputs a low-level signal.

The controller 5B controls the above-described threshold voltage generation circuit based on output of the comparator 4B. More specifically, the controller 5B controls resistance value of the variable resistor 3. In addition, it is also allowable that the constant voltage source 1 is changed to a variable voltage source, where the controller 5B controls output voltage of the variable voltage source.

Under the control by the controller 5B, the threshold voltage generation circuit repeats the following operations including:

(1) increasing the second threshold voltage $V_{TH2}$ stepwise;

(2) when the variation detection-target voltage $V_{TG}$ has come to the second threshold voltage $V_{TH2}$ or less, decreasing the second threshold voltage $V_{TH2}$ by specified steps;

(3) again increasing the second threshold voltage $V_{TH2}$ stepwise; and (4) when the variation detection-target voltage $V_{TG}$ has come to the second threshold voltage $V_{TH2}$ or less, decreasing the second threshold voltage $V_{TH2}$ by specified steps.

In addition, there are some cases where the second threshold voltage $V_{TH2}$ cannot be decreased by specified steps because the second threshold voltage $V_{TH2}$ is excessively low at a time point when the variation detection-target voltage $V_{TG}$ comes to the second threshold voltage $V_{TH2}$ or less. In this case, the threshold voltage generation circuit sets the second threshold voltage $V_{TH2}$ to a minimum (see $V_{TH2\_MIN}$ in FIG. 5) instead of decreasing the second threshold voltage $V_{TH2}$ by specified steps.

Figure 5:
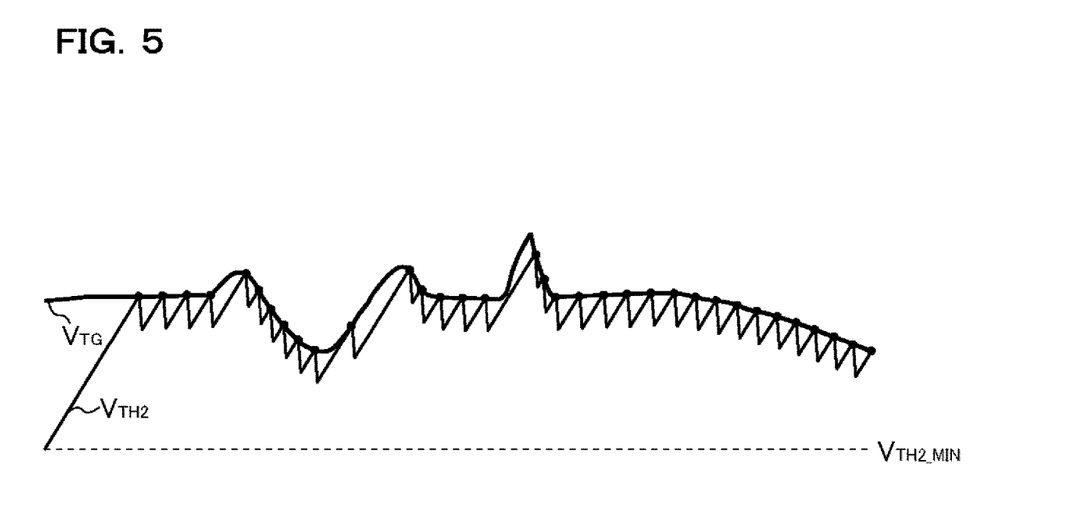
FIG. 5 is a time chart showing a detection-target voltage and a second threshold voltage.

With the above-described control by the controller 5B, the second threshold voltage $V_{TH2}$ varies as shown in FIG. 5. Although the second threshold voltage $V_{TH2}$ is charted seemingly in a continuously-varying way in FIG. 5 for convenience' sake, the second threshold voltage $V_{TH2}$ actually changes stepwise as apparent from the above description.

The controller 5B detects a variation of the variation detection-target voltage $V_{TG}$ based on control results at time points when the variation detection-target voltage $V_{TG}$ comes to the second threshold voltage $V_{TH2}$ or less (see black dots in FIG. 5). That is, from control results (resistance values of the variable resistor 3) at time points of transition of the variation detection-target voltage $V_{TG}$ to the second threshold voltage $V_{TH2}$ or less (see black dots in FIG. 5), the controller 5B detects values of the variation detection-target voltage $V_{TG}$ at the time points, respectively, of transition of the variation detection-target voltage $V_{TG}$ to the second threshold voltage $V_{TH2}$ or less (see black dots in FIG. 5), thereby detecting variations of the variation detection-target voltage $V_{TG}$. The controller 5B outputs a notification signal SA for notification of a detection result as to variations of the variation detection-target voltage $V_{TG}$. In addition, for cases in which a plurality of types of detection results as to variations of the variation detection-target voltage $V_{TG}$ are involved, the notification signal SA may be multi-valued or a plurality of types of notification signals SA may be provided.

The controller 5B, like the controller 5A, may also be so arranged as to detect at least one of an oscillation of the variation detection-target voltage $V_{TG}$, a spike of the variation detection-target voltage $V_{TG}$, and a drift of the variation detection-target voltage $V_{TG}$.

Further, on condition that the variation detection-target voltage $V_{TG}$ is equal to or less than the second threshold voltage $V_{TH2}$ at the time when the second threshold voltage $V_{TH2}$ is at a minimum, the controller 5B detects that the variation detection-target voltage $V_{TG}$ has become a low voltage. Upon detection that the variation detection-target voltage $V_{TG}$ has become a low voltage, the controller 5B outputs a low-voltage notification signal SC for notifying that the variation detection-target voltage $V_{TG}$ has become a low voltage. Therefore, the voltage variation detection circuit shown in FIG. 4 serves also as a low-voltage detection circuit.

The above-described voltage variation detection circuit shown in FIG. 4 is enabled to detect variations in the variation detection-target voltage $V_{TG}$ with a structure involving no A/D converter.

In addition, only with the above-described operations, there would occur a glitch in the case where when the variation detection-target voltage $V_{TG}$ has come to the second threshold voltage $V_{TH2}$ or less and then the second threshold voltage $V_{TH2}$ is decreased by specified steps, the variation detection-target voltage $V_{TG}$ becomes higher than the second threshold voltage $V_{TH2}$. More specifically, it is made impossible for the variation detection-target voltage $V_{TG}$ to come again to the second threshold voltage $V_{TH2}$ or less.

Accordingly, in the case where the variation detection-target voltage $V_{TG}$ does not come to the second threshold voltage $V_{TH2}$ or less even by increasing the second threshold voltage $V_{TH2}$ stepwise until the second threshold voltage $V_{TH2}$ reaches a specified increment or specified value, it is preferable that the threshold voltage generation circuit sets the second threshold voltage $V_{TH2}$ to a minimum before performing the operation of again increasing the second threshold voltage $V_{TH2}$ stepwise.

Third Configuration Example

Figure 6:
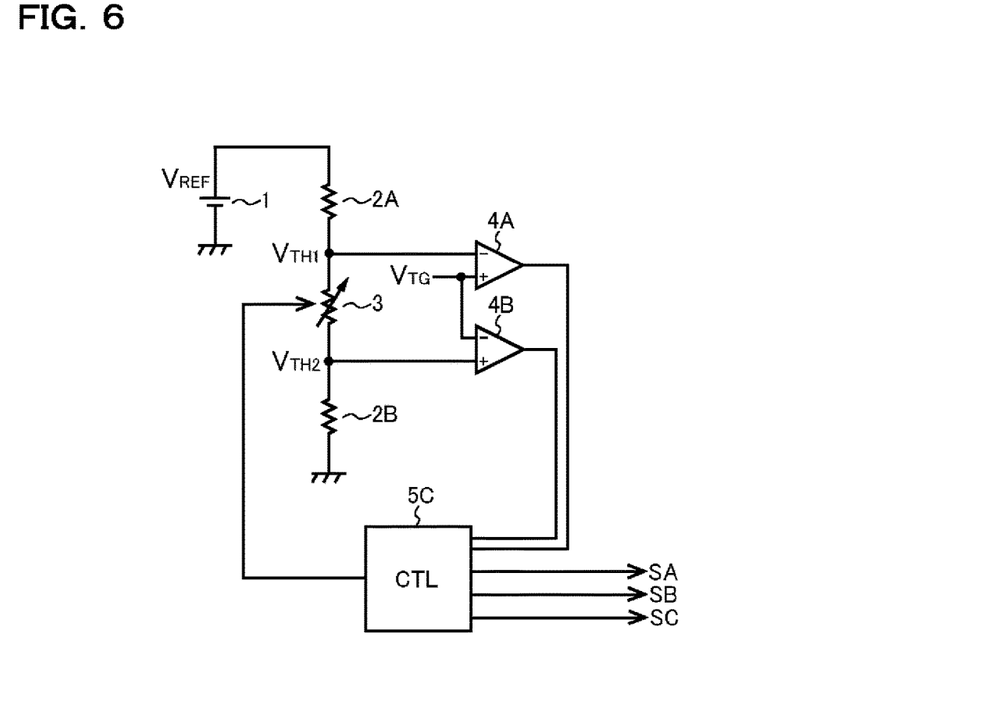
FIG. 6 is a diagram showing a third configuration example of the voltage variation detection circuit.

FIG. 6 is a diagram showing a third configuration example of the voltage variation detection circuit. The voltage variation detection circuit shown in FIG. 6 includes a constant voltage source 1, fixed resistors 2A and 28, a variable resistor 3, comparators 4A and 4B, and a controller 5C. It is noted that the same component members in FIG. 6 as in FIGS. 1 and 4 are designated by the same reference signs, and their detailed description is omitted.

A threshold voltage generation circuit arranged to generate a first threshold voltage $V_{TH1}$ and a second threshold voltage $V_{TH2}$ includes the constant voltage source 1, the fixed resistor 2A, the variable resistor 3, and the fixed resistor 2B. A voltage dividing circuit composed of the fixed resistor 2A, the variable resistor 3 and the fixed resistor 2B generates a first threshold voltage $V_{TH1}$ and a second threshold voltage $V_{TH2}$ which are partial voltages of a reference voltage $V_{REF}$. The reference voltage $V_{REF}$ is applied to a first terminal of the fixed resistor 2A, and a first terminal of the variable resistor 3 is connected to a second terminal of the fixed resistor 2A. A first terminal of the fixed resistor 2B is connected to a second terminal of the variable resistor 3, and a second terminal of the fixed resistor 2B is grounded. The first threshold voltage $V_{TH1}$ is developed to a connection node between the fixed resistor 2A and the variable resistor 3, and the second threshold voltage $V_{TH2}$ is developed to a connection node between the variable resistor 3 and the fixed resistor 2B. The higher the resistance value of the variable resistor 3 becomes, the higher the first threshold voltage $V_{TH1}$ becomes and the lower the second threshold voltage $V_{TH2}$ becomes.

The controller 5C controls the above-described threshold voltage generation circuit based on output of the comparator 4A and output of the comparator 4B. More specifically, the controller 5C controls resistance value of the variable resistor 3.

Under the control by the controller 5C, the threshold voltage generation circuit repeats the following operations including:

(1) decreasing the first threshold voltage $V_{TH1}$ stepwise and increasing the second threshold voltage $V_{TH2}$ stepwise;

(2) when the variation detection-target voltage $V_{TG}$ has come to the first threshold voltage $V_{TH1}$ or more or to the second threshold voltage $V_{TH2}$ or less, increasing the first threshold voltage $V_{TH1}$ by specified steps and decreasing the second threshold voltage $V_{TH2}$ by specified steps;

(3) again decreasing the first threshold voltage $V_{TH1}$ stepwise and increasing the second threshold voltage $V_{TH2}$ stepwise; and (4) when the variation detection-target voltage $V_{TG}$ has come to the first threshold voltage $V_{TH1}$ or more or to the second threshold voltage $V_{TH2}$ or less, increasing the first threshold voltage $V_{TH1}$ by specified steps and decreasing the second threshold voltage $V_{TH2}$ by specified steps.

In addition, there are some cases where the first threshold voltage $V_{TH1}$ cannot be increased by specified steps because the first threshold voltage $V_{TH1}$ is excessively high at a time point when the variation detection-target voltage $V_{TG}$ comes to the first threshold voltage $V_{TH1}$ or more. In this case, the threshold voltage generation circuit sets the first threshold voltage $V_{TH1}$ to a maximum instead of increasing the first threshold voltage $V_{TH1}$ by specified steps.

Also, there are some cases where the second threshold voltage $V_{TH2}$ cannot be decreased by specified steps because the second threshold voltage $V_{TH2}$ is excessively low at a time point when the variation detection-target voltage $V_{TG}$ comes to the second threshold voltage $V_{TH2}$ or less. In this case, the threshold voltage generation circuit sets the second threshold voltage $V_{TH2}$ to a minimum instead of decreasing the second threshold voltage $V_{TH2}$ by specified steps.

Figure 7:
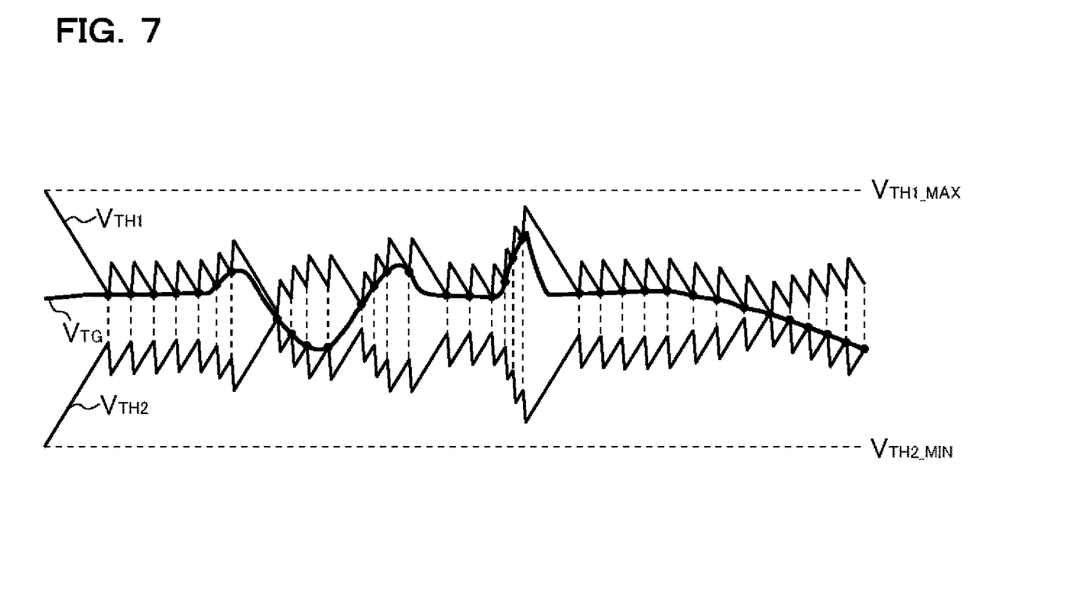
FIG. 7 is a time chart showing a detection-target voltage, a first threshold voltage, and a second threshold voltage.

With the above-described control by the controller 5C, the first threshold voltage $V_{TH1}$ and the second threshold voltage $V_{TH2}$ vary as shown in FIG. 7. Although the first threshold voltage $V_{TH1}$ and the second threshold voltage $V_{TH2}$ are charted seemingly in a continuously-varying way in FIG. 7 for convenience' sake, the first threshold voltage $V_{TH1}$ and the second threshold voltage $V_{TH2}$ actually change stepwise as apparent from the above description.

The controller 5C detects a variation of the variation detection-target voltage $V_{TG}$ based on control results at time points when the variation detection-target voltage $V_{TG}$ comes to the first threshold voltage $V_{TH1}$ or more or to the second threshold voltage $V_{TH2}$ or less (see black dots in FIG. 7). That is, from control results (resistance values of the variable resistor 3) at time points of transition of the variation detection-target voltage $V_{TG}$ to the first threshold voltage $V_{TH1}$ or more or to the second threshold voltage $V_{TH2}$ or less (see black dots in FIG. 7), the controller 5C detects values of the variation detection-target voltage $V_{TG}$ at the time points, respectively, of transition of the variation detection-target voltage $V_{TG}$ to the first threshold voltage $V_{TH1}$ or more or to the second threshold voltage $V_{TH2}$ or less (see black dots in FIG. 7), thereby detecting variations of the variation detection-target voltage $V_{TG}$. The controller 5C outputs a notification signal SA for notification of a detection result as to variations of the variation detection-target voltage $V_{TG}$. In addition, for cases in which a plurality of types of detection results as to variations of the variation detection-target voltage $V_{TG}$ are involved, the notification signal SA may be multi-valued or a plurality of types of notification signals SA may be provided.

The controller 5C, like the controllers 5A and 58, may also be so arranged as to detect at least one of an oscillation of the variation detection-target voltage $V_{TG}$, a spike of the variation detection-target voltage $V_{TG}$, and a drift of the variation detection-target voltage $V_{TG}$.

Further, on condition that the variation detection-target voltage $V_{TG}$ is equal to or more than the first threshold voltage $V_{TH1}$ while the first threshold voltage $V_{TH1}$ is at a maximum, the controller 5C detects that the variation detection-target voltage $V_{TG}$ has become an overvoltage. Upon detection that the variation detection-target voltage $V_{TG}$ has become an overvoltage, the controller 5C outputs an overvoltage notification signal SB for notifying that the variation detection-target voltage $V_{TG}$ has become an overvoltage. Therefore, the voltage variation detection circuit shown in FIG. 6 serves also as an overvoltage detection circuit.

Still further, on condition that the variation detection-target voltage $V_{TG}$ is equal to or less than the second threshold voltage $V_{TH2}$ while the second threshold voltage $V_{TH2}$ is at a minimum, the controller 5C detects that the variation detection-target voltage $V_{TG}$ has become a low voltage. Upon detection that the variation detection-target voltage $V_{TG}$ has become a low voltage, the controller 5C outputs a low-voltage notification signal SC for notifying that the variation detection-target voltage $V_{TG}$ has become a low voltage. Therefore, the voltage variation detection circuit shown in FIG. 6 serves also as a low-voltage detection circuit.

The above-described voltage variation detection circuit shown in FIG. 6 is enabled to detect variations in the variation detection-target voltage $V_{TG}$ with a structure involving no A/D converter.

With the voltage variation detection circuit shown in FIG. 6, there occurs no glitch even in the case where, after the variation detection-target voltage $V_{TG}$ has come to the first threshold voltage $V_{TH1}$ or more and when the first threshold voltage $V_{TH1}$ is increased by specified steps, the variation detection-target voltage $V_{TG}$ becomes higher than the first threshold voltage $V_{TH1}$. This is because stepwise increases of the second threshold voltage $V_{TH2}$ allows the variation detection-target voltage $V_{TG}$ to come to the second threshold voltage $V_{TH2}$ or less. Also, there occurs no glitch even in the case where, after the variation detection-target voltage $V_{TG}$ has come to the second threshold voltage $V_{TH2}$ or less and when the second threshold voltage $V_{TH2}$ is decreased by specified steps, the variation detection-target voltage $V_{TG}$ becomes higher than the second threshold voltage $V_{TH2}$. This is because stepwise decreases of the first threshold voltage $V_{TH1}$ allows the variation detection-target voltage $V_{TG}$ to come to the first threshold voltage $V_{TH1}$ or more.

<Power Unit>

Figure 8:
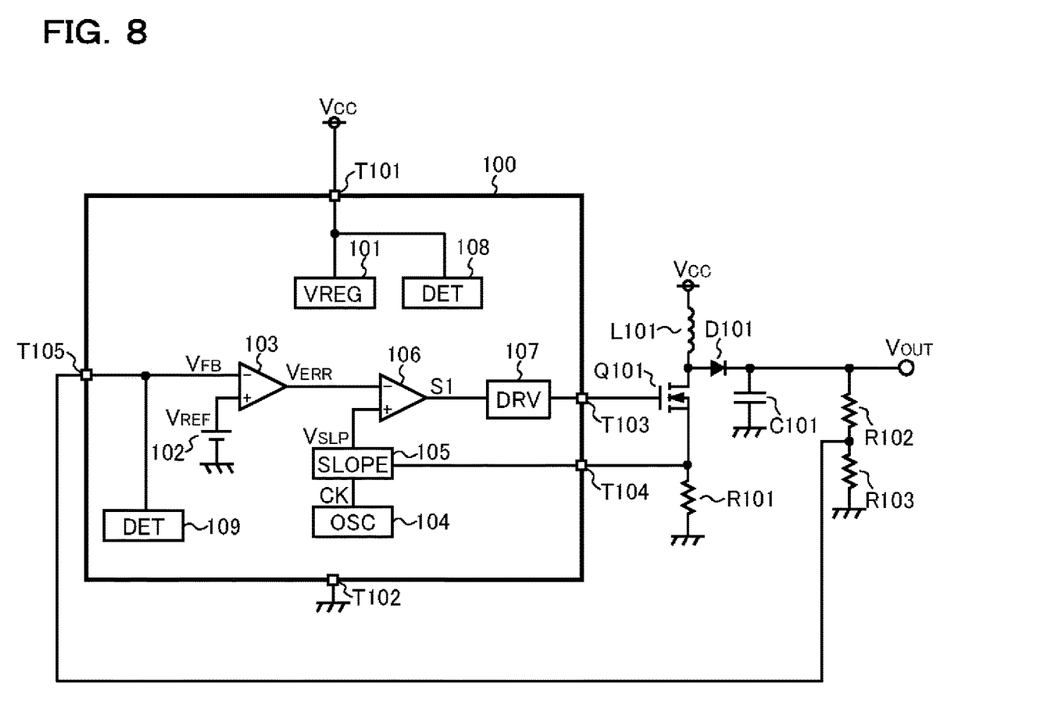
FIG. 8 is a diagram showing a configuration example of a power unit.
Figure 9:
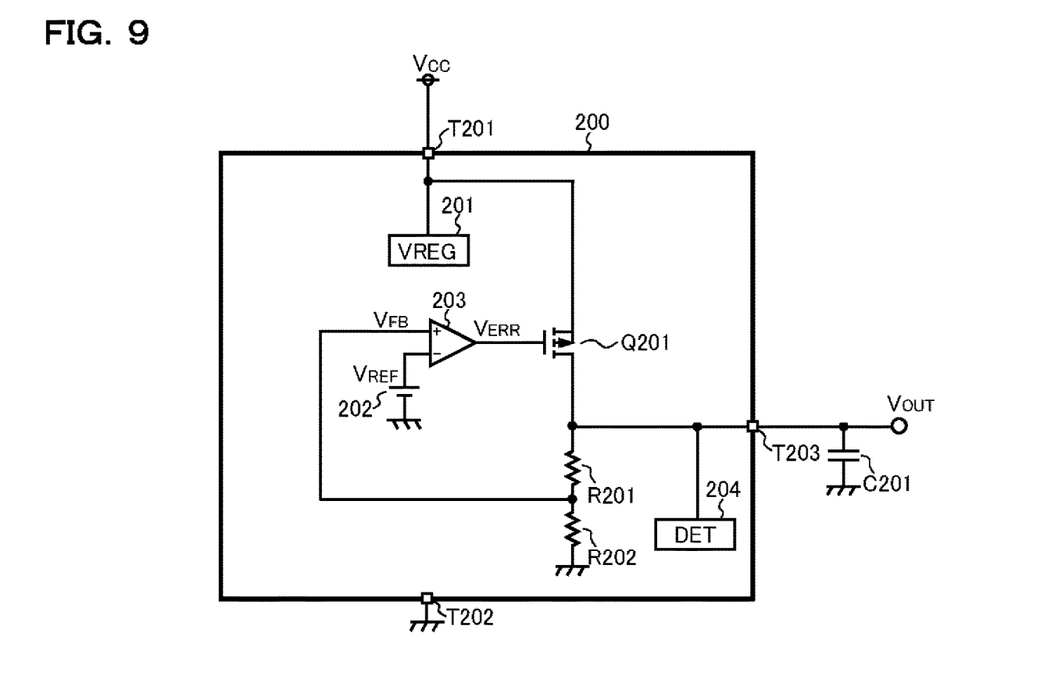
FIG. 9 is a diagram showing another configuration example of the power unit.

The above-described voltage variation detection circuit is mounted, for example, on a power IC as one component of a power unit. FIG. 8 is a diagram showing a configuration example of a switching power unit including the voltage variation detection circuit. FIG. 9 is a diagram showing a configuration example of an LDO (Low Drop-Out regulator) including the voltage variation detection circuit.

The switching power unit shown in FIG. 8 includes a switching power IC 100.

The switching power IC 100 is a semiconductor integrated circuit device in which integrated are a regulation voltage generator 101, a constant voltage source 102, an error amplifier 103, an oscillation circuit 104, a slope voltage generator 105, a PWM comparator 106, a driver 107, and voltage variation detection circuits 108 and 109. Also, the switching power IC 100 has external terminals T101 to T105 for establishment of electrical connections with the external.

Externally connected to the switching power IC 100 are a coil L101, an N-channel type MOS field-effect transistor Q101 (hereinafter, referred to as NMOS transistor Q101), a diode D101, an output capacitor C101, and resistors R101 to R103.

A power supply voltage Vcc is applied to the external terminal T101, and the external terminal T102 is grounded. The power supply voltage Vcc is applied to a first terminal of the coil L101, and a second terminal of the coil L101 is connected to a drain of the NMOS transistor Q101 and an anode of the diode D101. A source of the NMOS transistor Q101 is grounded via the resistor R101 for current detection. A gate of the NMOS transistor Q101 is connected to the external terminal T103, and the source of the NMOS transistor Q101 is connected to the external terminal T104.

A cathode of the diode D101 is connected to a first terminal of the output capacitor C101 and a first terminal of the resistor R102. A second terminal of the output capacitor C101 is grounded. A second terminal of the resistor R102 is connected to the external terminal T105 and a first terminal of the resistor R103. A second terminal of the resistor R103 is grounded. A voltage dividing circuit composed of the resistors R102 and R103 generates a feedback voltage $V_{FB}$ by dividing an output voltage $V_{OUT}$ of the switching power unit, and feeds the feedback voltage $V_{FB}$ to the external terminal T105.

Next, an outline of individual circuit blocks integrated in the switching power IC 100 will be described.

The regulation voltage generator 101 generates a regulation voltage $V_{REG}$ from the power supply voltage Vcc applied to the external terminal T101. The regulation voltage $V_{REG}$ is used as a drive voltage for other circuit blocks.

The constant voltage source 102 generates a reference voltage $V_{REF}$. The error amplifier 103 generates an error voltage $V_{ERR}$ responsive to a difference between the reference voltage $V_{REF}$ applied to its noninverting input terminal (+) and the feedback voltage $V_{FB}$ applied to its inverting input terminal (−).

The oscillation circuit 104 generates a clock signal CK. The slope voltage generator 105 generates a chopping-wave or sawtooth-wave shaped slope voltage $V_{SLP}$ responsive to a current detected by the resistor R101 with use of the clock signal CK.

The PWM comparator 106 compares an error voltage $V_{ERR}$ applied to the inverting input terminal (−) and a slope voltage $V_{SLP}$ applied to the noninverting input terminal (+) to each other to generate a PWM signal S1 responsive to a comparison result.

The driver 107 generates a gate signal of the NMOS transistor Q101 in response to the PWM signal S1, and outputs the gate signal to the external terminal T103. The NMOS transistor Q101 is on/off controlled by the gate signal outputted from the external terminal T103.

The voltage variation detection circuit 108 detects a variation of the power supply voltage Vcc. For example, assuming that the power supply voltage Vcc is obtained from output voltage of a battery, for fear of decline in the power supply voltage Vcc, the voltage variation detection circuit shown in FIG. 4 may appropriately be used as the voltage variation detection circuit 108.

The voltage variation detection circuit 109 detects a variation of the feedback voltage $V_{FB}$. Because of possibilities that the feedback voltage $V_{FB}$ may be an overvoltage or a low voltage, the voltage variation detection circuit shown in FIG. 6 may appropriately be used as the voltage variation detection circuit 109.

Notification signals outputted from the voltage variation detection circuits 108 and 109 are usable, for example, as signals for instructing operation halts of the PWM comparator 106, the driver 107 and the like. Further, external terminals for externally outputting notification signals outputted from the voltage variation detection circuits 108 and 109 may be provided in the switching power IC 100, and notification signals outputted from the voltage variation detection circuits 108 and 109 may be outputted outside the switching power IC 100.

Although the voltage variation detection circuit 109 has a constant voltage source for generating the reference voltage $V_{REF}$, it is unadvisable to make shared use between the constant voltage source of the voltage variation detection circuit 109 and the constant voltage source 102. As to the reason of this, providing the constant voltage source of the voltage variation detection circuit 109 and the constant voltage source 102 as circuits independent of each other allows the voltage variation detection circuit 109 to detect a variation of the feedback voltage $V_{FB}$ even when the feedback voltage $V_{FB}$ has varied due to an abnormality of the constant voltage source 102. On the other hand, the constant voltage source of the voltage variation detection circuit 108 may be provided by shared use of, for example, the constant voltage source of the voltage variation detection circuit 109.

The LDO shown in FIG. 9 includes an LDO IC 200.

The LDO IC 200 is a semiconductor integrated circuit device in which integrated are a regulation voltage generator 201, a constant voltage source 202, an error amplifier 203, a P-channel type MOS field-effect transistor Q201 (hereinafter, referred to as PMOS transistor Q201), resistors R201 and R202, and a voltage variation detection circuit 204. Also, the LDO IC 200 has external terminals T201 to T203 for establishment of electrical connections with the external.

An output capacitor C201 is externally connected to the LDO IC 200.

A power supply voltage Vcc is applied to the external terminal T201, and the external terminal T202 is grounded. A first terminal of the output capacitor C201 is connected to the external terminal T203, and a second terminal of the output capacitor C201 is grounded.

Next, an outline of individual circuit blocks integrated in the LDO IC 200 will be described.

The regulation voltage generator 201 generates a regulation voltage $V_{REG}$ from the power supply voltage Vcc applied to the external terminal T201. The regulation voltage $V_{REG}$ is used as a drive voltage for other circuit blocks.

The PMOS transistor Q201 generates an output voltage $V_{OUT}$ by stepping down the power supply voltage Vcc and outputs the output voltage $V_{OUT}$ to the external terminal T203. A voltage dividing circuit composed of the resistors R201 and R202 generates a feedback voltage $V_{FB}$ by dividing the output voltage $V_{OUT}$.

The constant voltage source 202 generates a reference voltage $V_{REF}$. The error amplifier 203 generates an error voltage $V_{ERR}$ responsive to a difference between the feedback voltage $V_{FB}$ applied to the noninverting input terminal (+) and the reference voltage $V_{REF}$ applied to the inverting input terminal (−). The error voltage $V_{ERR}$ is fed to the gate of the PMOS transistor Q201. Therefore, on-resistance of the PMOS transistor Q201 is regulated by the error voltage $V_{ERR}$.

The voltage variation detection circuit 204 detects a variation of the output voltage $V_{OUT}$. The voltage variation detection circuit shown in FIG. 1, as an example, may appropriately be used as the voltage variation detection circuit 204.

A notification signal outputted from the voltage variation detection circuit 204 is usable, for example, as a signal for instructing an operation halt of the error amplifier 203. Further, an external terminal for externally outputting a notification signal outputted from the voltage variation detection circuit 204 may be provided in the LDO IC 200, and a notification signal outputted from the voltage variation detection circuit 204 may be outputted outside the LDO IC 200.

Although the voltage variation detection circuit 204 has a constant voltage source for generating the reference voltage $V_{REF}$, it is unadvisable to make shared use between the constant voltage source of the voltage variation detection circuit 204 and the constant voltage source 202. As to the reason of this, providing the constant voltage source of the voltage variation detection circuit 204 and the constant voltage source 202 as circuits independent of each other allows the voltage variation detection circuit 204 to detect a variation of the output voltage $V_{OUT}$ even when the output voltage $V_{OUT}$ has varied due to an abnormality of the constant voltage source 202.

<Application Examples of Power Unit>

Figure 10:
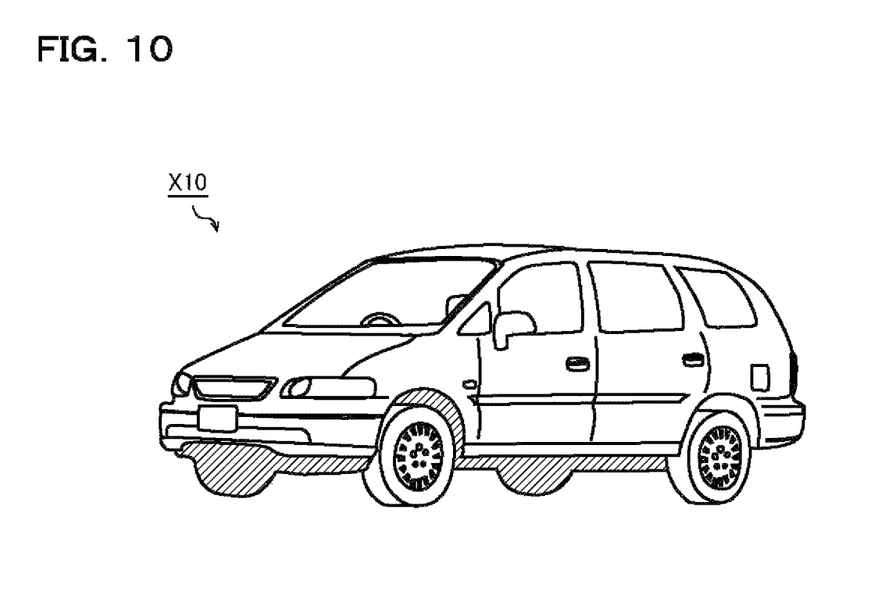
FIG. 10 is an appearance view of a vehicle on which the power unit is to be mounted.

The above-described power unit is mounted, for example, on a vehicle X10 shown in FIG. 10. The switching power unit shown in FIG. 8, for example, is usable as a power unit for feeding power supply voltage to the MCU (Micro Control Unit) mounted on the vehicle X10. The LDO shown in FIG. 9, for example, is usable as the power unit for feeding power supply voltage to a camera and a sensor for use in advanced operation aid systems mounted on the vehicle X10.

<Notes>

Various technical features herein disclosed may be changed in various ways within a scope that does not depart from the gist of their technical contrivance, as well as the above-described embodiments. For example, although the output stage of the switching power circuit is provided as a step-up type one as an example in FIG. 8, the output stage is not limited to this and may be easily adapted to any one of step-down type, step-up/down type, and SEPIC type. That is, the foregoing embodiments should be construed as not being limitative but being an exemplification at all points. The technical scope of the present invention should be defined not by the above description of the embodiments but by the appended claims, including all changes and modifications equivalent in sense and range to the claims.

<Conclusions>

A voltage variation detection circuit according to a first configuration described hereinabove includes: a threshold voltage generation circuit arranged to generate a threshold voltage; a comparator arranged to compare a variation detection-target voltage and the threshold voltage to each other; and a controller arranged to control the threshold voltage generation circuit based on output of the comparator, wherein the controller controls the threshold voltage generation circuit in such fashion that the threshold voltage generation circuit repeats operations of: decreasing the threshold voltage stepwise; when the variation detection-target voltage has come to the threshold voltage or more, first increasing the threshold voltage by specified steps and then again decreasing the threshold voltage stepwise; and when the variation detection-target voltage has come to the threshold voltage or more, increasing the threshold voltage by specified steps, and wherein the controller detects a variation of the variation detection-target voltage based on control results at time points when the variation detection-target voltage comes to the threshold voltage or more.

In the voltage variation detection circuit according to the first configuration, when the variation detection-target voltage does not come to the threshold voltage or more even by decreasing the threshold voltage stepwise until the threshold voltage reaches a specified decrement or specified value, the controller may set the threshold voltage to a maximum before again decreasing the threshold voltage stepwise (second configuration).

A voltage variation detection circuit according to a third configuration described hereinabove includes: a threshold voltage generation circuit arranged to generate a threshold voltage; a comparator arranged to compare a variation detection-target voltage and the threshold voltage to each other; and a controller arranged to control the threshold voltage generation circuit based on output of the comparator, wherein the controller controls the threshold voltage generation circuit in such fashion that the threshold voltage generation circuit repeats operations of: increasing the threshold voltage stepwise; when the variation detection-target voltage has come to the threshold voltage or less, first decreasing the threshold voltage by specified steps and then again increasing the threshold voltage stepwise; and when the variation detection-target voltage has come to the threshold voltage or less, decreasing the threshold voltage by specified steps, and wherein the controller detects a variation of the variation detection-target voltage based on control results at time points when the variation detection-target voltage comes to the threshold voltage or less.

In the voltage variation detection circuit according to the third configuration, when the variation detection-target voltage does not come to the threshold voltage or less even by increasing the threshold voltage stepwise until the threshold voltage reaches a specified increment or specified value, the controller may set the threshold voltage to a minimum before again increasing the threshold voltage stepwise (fourth configuration).

A voltage variation detection circuit in a fifth configuration described hereinabove includes: a threshold voltage generation circuit arranged to generate a first threshold voltage and a second threshold voltage lower than the first threshold voltage; a first comparator arranged to compare a variation detection-target voltage and the first threshold voltage to each other; a second comparator arranged to compare the variation detection-target voltage and the second threshold voltage to each other; and a controller arranged to control the threshold voltage generation circuit based on output of the first comparator and output of the second comparator, wherein the controller controls the threshold voltage generation circuit in such fashion that the threshold voltage generation circuit repeats operations of: decreasing the first threshold voltage stepwise and increasing the second threshold voltage stepwise; when the variation detection-target voltage has come to the first threshold voltage or more or to the second threshold voltage or less, first increasing the first threshold voltage by specified steps and decreasing the second threshold voltage by specified steps and then again decreasing the first threshold voltage stepwise and increasing the second threshold voltage stepwise; and when the variation detection-target voltage has come to the threshold voltage or more or to the second threshold voltage or less, increasing the first threshold voltage by specified steps and decreasing the second threshold voltage by specified steps, and wherein the controller detects a variation of the variation detection-target voltage based on control results at time points when the variation detection-target voltage comes to the first threshold voltage or more or to the second threshold voltage or less.

In the voltage variation detection circuit according to the fifth configuration, the threshold voltage generation circuit may include: a first fixed resistor; a variable resistor whose resistance value is variable stepwise; and a second fixed resistor, wherein a reference voltage is applied to a first terminal of the first fixed resistor, a first terminal of the variable resistor is connected to a second terminal of the first fixed resistor, a first terminal of the second fixed resistor is connected to a second terminal of the variable resistor, a second terminal of the second fixed resistor is grounded, and the first threshold voltage is developed to a connection node between the first fixed resistor and the variable resistor while the second threshold voltage is developed to a connection node between the variable resistor and the second fixed resistor (sixth configuration).

In the voltage variation detection circuit according to any one of the first, second, fifth, and sixth configurations, the controller may detect that the variation detection-target voltage has become an overvoltage on condition that the variation detection-target voltage is equal to or more than the first threshold voltage when the first threshold voltage is at a maximum (seventh configuration).

In the voltage variation detection circuit according to any one of the third to sixth configurations, the controller may detect that the variation detection-target voltage has become a low voltage on condition that the variation detection-target voltage is equal to or less than the second threshold voltage when the second threshold voltage is at a minimum (eighth configuration).

In the voltage variation detection circuit according to any one of the first to eighth configurations, the controller may detect at least one of an oscillation of the variation detection-target voltage, a spike of the variation detection-target voltage, and a drift of the variation detection-target voltage (ninth configuration).

A semiconductor integrated circuit described hereinabove includes: the voltage variation detection circuit according to any one of the first to ninth configurations; and at least part of a voltage generation circuit arranged to generate the variation detection-target voltage (tenth configuration).

A vehicle described hereinabove includes: the semiconductor integrated circuit according to the tenth configuration (eleventh configuration).

What is claimed is:

1. A voltage variation detection circuit comprising:
    a threshold voltage generation circuit arranged to generate a threshold voltage;
    a comparator arranged to compare a variation detection-target voltage and the threshold voltage to each other; and
    a controller arranged to control the threshold voltage generation circuit based on output of the comparator,
    wherein the controller controls the threshold voltage generation circuit in such fashion that the threshold voltage generation circuit repeats operations of: decreasing the threshold voltage stepwise; when the variation detection-target voltage has come to the threshold voltage or more, first increasing the threshold voltage by specified steps to increase the threshold voltage by a fixed value and then again decreasing the threshold voltage stepwise; and when the variation detection-target voltage has come to the threshold voltage or more, increasing the threshold voltage by specified steps to increase the threshold voltage by a fixed value, and
    wherein the controller detects a variation of the variation detection-target voltage based on control results at time points when the variation detection-target voltage comes to the threshold voltage or more.

2. The voltage variation detection circuit according to claim 1, wherein
    when the variation detection-target voltage does not come to the threshold voltage or more even by decreasing the threshold voltage stepwise until the threshold voltage reaches a specified decrement or specified value, the threshold voltage generation circuit sets the threshold voltage to a maximum before again decreasing the threshold voltage stepwise.

3. The voltage variation detection circuit according to claim 1, wherein
    the controller
    detects that the variation detection-target voltage has become an overvoltage on condition that the variation detection-target voltage is equal to or more than the threshold voltage when the threshold voltage is at a maximum.

4. The voltage variation detection circuit according to claim 1, wherein
the controller detects at least one of an oscillation of the variation detection-target voltage, a spike of the variation detection-target voltage, and a drift of the variation detection-target voltage.

5. A semiconductor integrated circuit comprising:
the voltage variation detection circuit according to claim 1; and
at least part of a voltage generation circuit arranged to generate the variation detection-target voltage.

6. A vehicle comprising:
the semiconductor integrated circuit according to claim 5.

7. A voltage variation detection circuit comprising:
a threshold voltage generation circuit arranged to generate a threshold voltage;
a comparator arranged to compare a variation detection-target voltage and the threshold voltage to each other; and
a controller arranged to control the threshold voltage generation circuit based on output of the comparator,
wherein the controller controls the threshold voltage generation circuit in such fashion that the threshold voltage generation circuit repeats operations of: increasing the threshold voltage stepwise; when the variation detection-target voltage has come to the threshold voltage or less, first decreasing the threshold voltage by specified steps to decrease the threshold voltage by a fixed value and then again increasing the threshold voltage stepwise; and when the variation detection-target voltage has come to the threshold voltage or less, decreasing the threshold voltage by specified steps to decrease the threshold voltage by a fixed value, and
wherein the controller detects a variation of the variation detection-target voltage based on control results at time points when the variation detection-target voltage comes to the threshold voltage or less.

8. The voltage variation detection circuit according to claim 7, wherein
when the variation detection-target voltage does not come to the threshold voltage or less even by increasing the threshold voltage stepwise until the threshold voltage reaches a specified increment or specified value, the threshold voltage generation circuit sets the threshold voltage to a minimum before again increasing the threshold voltage stepwise.

9. The voltage variation detection circuit according to claim 7, wherein
the controller
detects that the variation detection-target voltage has become a low voltage on condition that the variation detection-target voltage is equal to or less than the threshold voltage when the threshold voltage is at a minimum.

10. The voltage variation detection circuit according to claim 7, wherein
the controller detects at least one of an oscillation of the variation detection-target voltage, a spike of the variation detection-target voltage, and a drift of the variation detection-target voltage.

11. A semiconductor integrated circuit comprising:
the voltage variation detection circuit according to claim 7; and
at least part of a voltage generation circuit arranged to generate the variation detection-target voltage.

12. A vehicle comprising:
the semiconductor integrated circuit according to claim 11.

13. A voltage variation detection circuit comprising:
a threshold voltage generation circuit arranged to generate a first threshold voltage and a second threshold voltage lower than the first threshold voltage;
a first comparator arranged to compare a variation detection-target voltage and the first threshold voltage to each other;
a second comparator arranged to compare the variation detection-target voltage and the second threshold voltage to each other; and
a controller arranged to control the threshold voltage generation circuit based on output of the first comparator and output of the second comparator,
wherein the controller controls the threshold voltage generation circuit in such fashion that the threshold voltage generation circuit repeats operations of: decreasing the first threshold voltage stepwise and increasing the second threshold voltage stepwise; when the variation detection-target voltage has come to the first threshold voltage or more or to the second threshold voltage or less, first increasing the first threshold voltage by specified steps to increase the first threshold voltage by a first fixed value and decreasing the second threshold voltage by specified steps to decrease the second threshold voltage by a second fixed value and then again decreasing the first threshold voltage stepwise and increasing the second threshold voltage stepwise; and when the variation detection-target voltage has come to the first threshold voltage or more or to the second threshold voltage or less, increasing the first threshold voltage by specified steps to increase the first threshold voltage by the first fixed value and decreasing the second threshold voltage by specified steps to decrease the second threshold voltage by the second fixed value, and
wherein the controller detects a variation of the variation detection-target voltage based on control results at time points when the variation detection-target voltage comes to the first threshold voltage or more or to the second threshold voltage or less.

14. The voltage variation detection circuit according to claim 13, wherein
the threshold voltage generation circuit includes:
a first fixed resistor;
a variable resistor whose resistance value is variable stepwise; and
a second fixed resistor,
wherein a reference voltage is applied to a first terminal of the first fixed resistor,
a first terminal of the variable resistor is connected to a second terminal of the first fixed resistor,
a first terminal of the second fixed resistor is connected to a second terminal of the variable resistor,
a second terminal of the second fixed resistor is grounded, and
the first threshold voltage is developed to a connection node between the first fixed resistor and the variable resistor while the second threshold voltage is developed to a connection node between the variable resistor and the second fixed resistor.

15. The voltage variation detection circuit according to claim 13, wherein
   the controller
   detects that the variation detection-target voltage has become an overvoltage on condition that the variation detection-target voltage is equal to or more than the first threshold voltage when the first threshold voltage is at a maximum.

16. The voltage variation detection circuit according to claim 13, wherein
   the controller
   detects that the variation detection-target voltage has become a low voltage on condition that the variation detection-target voltage is equal to or less than the second threshold voltage when the second threshold voltage is at a minimum.

17. The voltage variation detection circuit according to claim 13, wherein
   the controller detects at least one of an oscillation of the variation detection-target voltage, a spike of the variation detection-target voltage, and a drift of the variation detection-target voltage.

18. A semiconductor integrated circuit comprising:
   the voltage variation detection circuit according to claim 13; and
   at least part of a voltage generation circuit arranged to generate the variation detection-target voltage.

19. A vehicle comprising:
   the semiconductor integrated circuit according to claim 18.

* * * * *